United States Patent [19]

Washizuka et al.

[11] Patent Number: 5,179,333
[45] Date of Patent: Jan. 12, 1993

[54] APPARATUS FOR MEASURING THE ELECTRICAL CHARACTERISTICS OF A SEMICONDUCTOR WAFER

[75] Inventors: Shoichi Washizuka, Yokohama; Takao Ohta, Tokyo, both of Japan

[73] Assignee: Kabushiki Kaisha Toshiba, Kawasaki, Japan

[21] Appl. No.: 614,153

[22] Filed: Nov. 16, 1990

[30] Foreign Application Priority Data

Nov. 17, 1989 [JP] Japan ................................. 1-299254
May 1, 1990 [JP] Japan ................................. 2-115491

[51] Int. Cl.$^5$ .................. G01R 19/00; G01R 31/02
[52] U.S. Cl. ..................... 324/158 R; 324/73.1; 437/8
[58] Field of Search ........... 324/158 D, 158 R, 731, 324/228, 233, 239, 236, 642, 252, 719; 437/8; 414/222, 223, 224, 225; 198/345.2

[56] References Cited

U.S. PATENT DOCUMENTS

| | | | |
|---|---|---|---|
| 3,805,160 | 4/1974 | Philbrick et al. | 324/158 D |
| 4,015,203 | 3/1977 | Verkuil | 324/158 D |
| 4,190,799 | 2/1980 | Miller et al. | 324/158 D |
| 4,644,172 | 2/1987 | Sandland et al. | 356/400 |
| 4,785,232 | 11/1988 | Ballato et al. | 324/727 |
| 4,857,839 | 8/1989 | Look et al. | 324/158 R |

OTHER PUBLICATIONS

M. C. Chen, "Sensitive contactless eddy-current conductivity measurements on Si and HgCdTe", Review of Scientific Instruments, vol. 60, No. 6, Jun. 1989, pp. 1116-1122.

M. J. Howes, "Direct Reading Mobility Indicator", Review of Scientific instruments, vol. 44, No. 9, Sep. 1973, pp. 1223-1225.

*Primary Examiner*—Vinh Nguyen
*Attorney, Agent, or Firm*—Foley & Lardner

[57] ABSTRACT

A semiconductor wafer evaluation apparatus, wherein a conductivity detector and a carrier mobility detector are independently arranged so that detections can be made under optimum conditions, respectively. A wafer carrying unit is arranged so as to carry or convey a semiconductor wafer on a carrying path between the two detectors. These components are controlled by a controller. A carrier concentration is calculated from the conductivity and the carrier mobility detected by both detectors. When a partition wall for preventing interference of an electromagnetic wave is provided between the conductivity detector and the carrier mobility detector, interference between the two detectors is further reduced.

11 Claims, 7 Drawing Sheets

APPARATUS FOR MEASURING THE ELECTRICAL CHARACTERISTICS OF A SEMICONDUCTOR WAFER

BACKGROUND OF THE INVENTION

This invention relates to an apparatus for automatically measuring the electrical characteristics such as carrier concentration, etc. of a semiconductor wafer.

In manufacturing a semiconductor device by using a semiconductor wafer, it is required to examine in advance its electric characteristics, such as conductivity, carrier mobility, and carrier concentration, etc. to make a wafer selection. If a judgment as to whether or not a wafer is bad is not made properly, a yield, reliability, and increased cost arise.

For examining the electric characteristic of a semiconductor wafer, there is an apparatus using the van der Pauw method which is a representative measurement method. With this device, however, since the formation of an ohmic electrode is required, the wafer must be destroyed.

In view of this, there is proposed an apparatus which does not require destruction of the wafer, as the device for measuring conductivity, carrier mobility, or carrier concentration (Japanese Patent Application Laid Open No. 136182/79).

In the case of such a conventional apparatus, however, the configuration of the detection system of the device becomes complicated and practical measurement accuracy cannot be provided. Since the optimum measurement condition of conductivity and carrier mobility are different from each other, it is difficult to satisfy both conditions at the same time. Further, because a strong magnetic field is required for measurement, the influence of the magnetic field may affect the measurement of conductivity.

However, in the case where the apparatus based on the van der Pauw method is used, it is impossible to measure the total number of wafers because of the destruction is stated above. It takes a long time for measurement, including the time required for preparing a sample. In addition, one is unable to make a detailed measurement of the distribution in the wafer plane. For this reason, it is impossible to examine whether or not the total number of wafers quarried from an ingot satisfy the carrier concentration standard, or to measure the sheet carrier concentration of an ion implanted layer by in-process. Accordingly, such an apparatus cannot contribute to management or control of the wafer quality or improvement in the wafer.

SUMMARY OF THE INVENTION

Accordingly, an object of this invention is to provide a semiconductor wafer evaluation apparatus which can automatically measure the carrier concentration of the semiconductor wafer in a non-destructive manner and with high accuracy, to thus attain improvement in wafer quality.

According to the present invention, there is provided a semiconductor wafer evaluation apparatus comprising:

a conductivity detector for allowing an eddy current to be produced on a semiconductor wafer to detect the magnitude of the eddy current to determine the conductivity of the semiconductor wafer, a carrier mobility detector for allowing an eddy current to be produced on the semiconductor wafer to detect a Hall electromotive force produced in a magnetic field by the eddy current to determine the carrier mobility, the conductivity detector and the carrier mobility detector being independently arranged so that detections can be made under optimum conditions, respectively, means for calculating a carrier concentration of the semiconductor wafer by using the conductivity and the carrier mobility which have been determined, wafer carrying means for carrying the semiconductor wafer between the conductivity detector and the carrier mobility detector, and control means for controlling the respective operations of said conductivity detector, the carrier mobility detector, and the wafer carrying means in accordance with a predetermined procedure so that the measurement of conductivity and the measurement of carrier mobility are carried out in succession.

In accordance with this apparatus, since a conductivity detector and a carrier mobility detector are independently arranged so that the conductivity and the carrier mobility can be detected under optimum conditions, respectively, when compared with an apparatus in which both functions are combined to conduct a measurement simultaneously, interference is prevented to a greater degree, thus making possible high-precision measurements. Since such measurements do not require destruction of the semiconductor wafer, measurement of the total number of wafers can be made, resulting in an improvement in yield and productivity. Furthermore, since the detection operation of the detector and the carrying operation of the carrying means are controlled in accordance with a predetermined procedure by the control means, respective measurements are automatically carried out in sequence, resulting in shortened measurement time.

In the case where a partition wall comprised of a material for absorbing an electromagnetic wave is further provided between the conductivity detector and the carrier mobility detector, respective detectors are prevented from interferencing with each other by an electromagnetic wave produced during the detecting operation. As a result, the measurement accuracy is improved.

Furthermore, in the case where an approach is employed to allow the wafer and the passive unit provided on the wafer stage of the carrier mobility detector to be in contact with each other to suck or absorb the wafer by a plurality of sucking units arranged at least doubly so as to surround the passive unit in that contact state to measure the carrier mobility in the state where the wafer and the passive unit are tightly in contact with each other, it is possible to allow the passive unit of the detector provided on the wafer stage and the wafer to be tightly in contact with each other, resulting in improvements in the reproducibility of measurement and stability in work, etc. In addition to this, when an arrangement is employed such that the sucking unit is divided into a plurality of areas, even if the mounting position of the wafer is shifted on the stage, it is possible to ensure that the wafer and the passive unit are caused to be in tight contact with each other by any divided area.

DESCRIPTION OF THE PREFERRED EMBODIMENT

A semiconductor wafer evaluation apparatus according to an embodiment of this invention will now be described with reference to the attached drawings.

Figure 1:
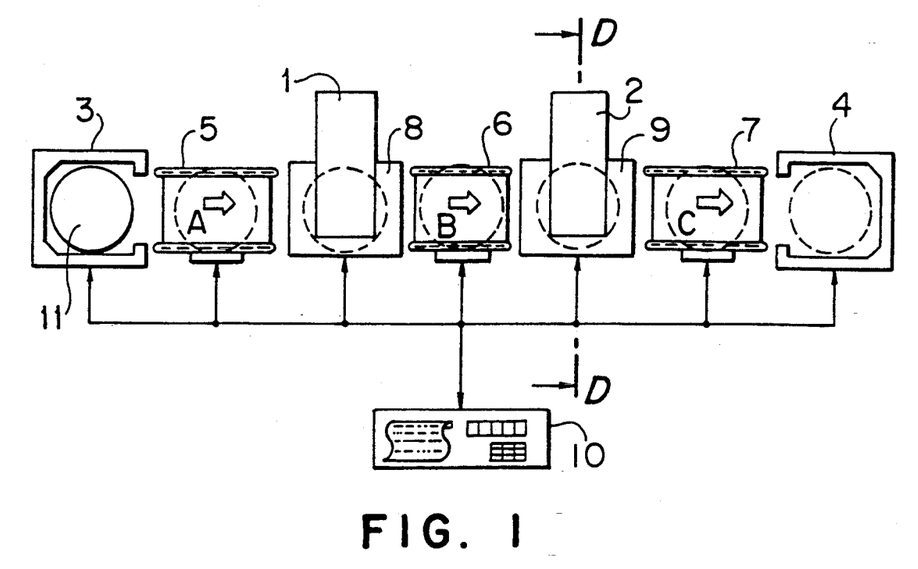
FIG. 1 is a block diagram showing the configuration of a semiconductor wafer evaluation apparatus according to a first embodiment of this invention.

FIG. 1 is a block diagram showing the configuration of the first embodiment. This apparatus is characterized in that the measurement of conductivity and the measurement of the carrier mobility are independently carried out under optimum conditions, respectively, and that all of the work needed for determining the carrier concentration by obtained measured values is automatically carried out.

The conductivity detector 1 generates an eddy current in a semiconductor wafer 11 on a wafer stage 8 to detect the magnitude of the eddy current to determine a conductivity. A carrier mobility detector 2 independently generates an eddy current in the semiconductor wafer 11 on a wafer stage 9 to detect a Hall electromotive force produced in a magnetic field to determine a carrier mobility. These detectors 1 and 2 independently carry out measurements on optimum conditions, respectively.

A wafer supply cassette 3 serves to supply a semiconductor wafer to be measured. Within this cassette 3, a large number of wafers are accommodated or received in advance. A wafer carrying device is the means for carrying the wafer 11 in a direction indicated by an arrow A in order to measure conductivity from the wafer supply cassette 3 to the wafer stage 8. Further, a wafer carrying device 6 is a means for carrying the wafer 11 in a direction indicated by an arrow B in order to measure conductivity from the wafer stage 8 to the wafer stage 9, and a wafer carrying device 7 is a means for carrying the wafer 11 in a direction indicated by an arrow C from the wafer stage 9 to the wafer accommodating cassette 4. The wafer accommodating cassette 4 accommodates therein wafers 11 in which measurement is completed. A controller 10 is a means for automatically controlling, in accordance with a predetermined measurement procedure, respective carrying operations of the wafer carrying devices 5 to 7, and the detecting operations of the conductivity detector 1 and the carrier mobility detector 2. Initial data such as kind, aperture, thickness, and measurement mode, etc. required for control are input in advance to the controller 10.

Figure 2:
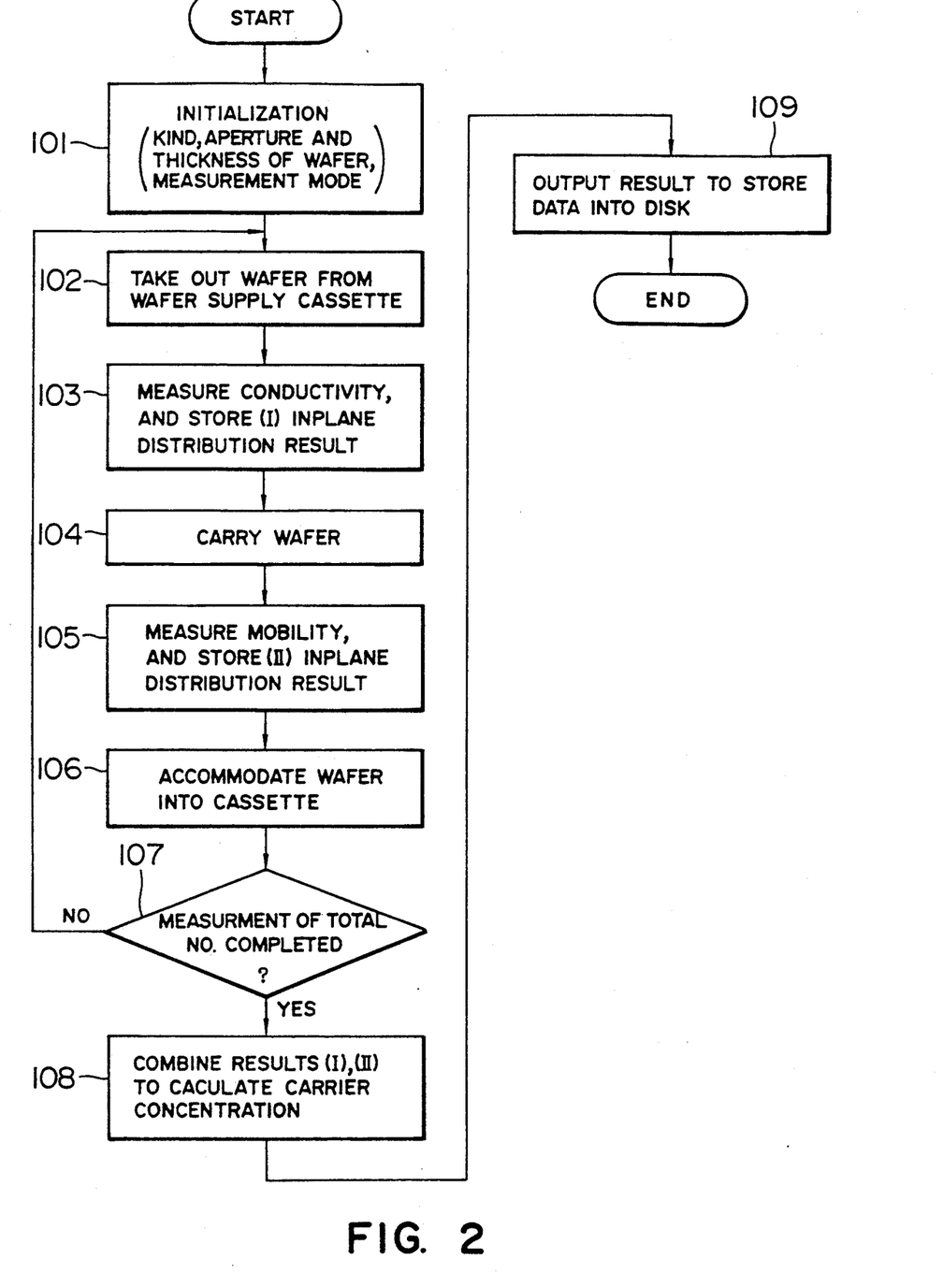
FIG. 2 is a flowchart showing the operating procedure of the above-mentioned apparatus.

The operation of the first embodiment constructed above will now be described with reference to the flowchart of FIG. 2. The operation described below is carried out by the sequence control of the controller 10. First, kind, aperture, thickness and measurement mode of the wafer are initially set at the controller 10 (step 101).

The semiconductor wafer 11 accommodated in the wafer supply cassette 3 is carried or conveyed to the wafer stage 8 by the wafer carrying device 5 (step 102), at which conductivity is measured by the conductivity detector 1. This measurement may be carried out, as described above, by generating an eddy current on the wafer 11 to detect the magnitude of that eddy current, but may be by any other measurement method in conformity with the measurement purpose. A measured result is delivered as a plane distribution result (I) of the wafer 11 from the conductivity detector 1 to the controller 10, and is then stored into the memory included in the controller 10 (step 103).

After the measurement of conductivity is completed, the wafer 11 is taken out from the wafer stage 8 by the wafer carrying device 6 in order to measure the carrier conductivity, and is then delivered to the wafer stage 9 (step 104). The carrier mobility measurement device 2 generates an eddy current on the wafer 11 to detect a Hall electromotive force produced in a magnetic field to determine a carrier mobility. Also in this case, measurement may be conducted by any other method in conformity with measurement purpose. A measured result is transferred to the controller 10 and stored thereinto as a plane distribution result (II) (step 105). When the measurement is completed, the wafer 11 is carried or conveyed to the wafer receiving cassette 4 by the wafer carrying device 7, and is accommodated thereinto (step 106). In a manner stated above, wafers 11 are measured in succession one by one until the measurement of the total number of wafers is completed (step 107).

When the measurement is completed, the controller 10 calculates a carrier concentration n from the well known relational equation expressed as $\sigma = en\mu$ ($\sigma$ = conductivity, e: electron charge, and $\mu$: carrier mobility) by using the conductivity obtained and the measured results (I) and (II) of the carrier mobility (step 108). Then, the controller 10 outputs a calculated result, e.g., in the form of print, etc. to store it into auxiliary memory means such as a disk, etc. (step 109). Finally, the measured results of the conductivity, the carrier mobility and the carrier conductivity thus obtained and the standard values are compared with each other, respectively. Thus, whether or not measured wafers are articles of good quality is appraised.

In accordance with the first embodiment, since it is possible to measure the conductivity and the carrier mobility of the semiconductor wafer without destroying the wafer, the measurement of the total number of wafers can be made, and the measurement of the sheet carrier concentration of the ion implanted layer can be conducted by in-process. Further, since the means 1 for measuring the conductivity and the means 2 for measuring the carrier mobility are independently provided, the conductivity and the carrier mobility can be measured under optimum conditions, respectively. Thus, the characteristic of the carrier concentration, etc. can be appraised with high accuracy.

Further, since an approach is employed to automatically carry or convey wafers between both measurement devices 1 and 2 by the controller, a large number of wafers can be processed in a short time. In the case where five points are measured in the wafer plane by the conventional measurement device using the van der Pauw method, it takes about three hours per wafer, including time for preparing the sample. In contrast, in this embodiment, a required measurement can be made within about one minute. It has been confirmed that improvement in the throughput of the order of two figures or more is made.

Since the total number of wafers can be examined because of non-destructive measurement and the improvement in throughput, it is possible to greatly lower the failure rate of wafers produced in the manufacturing process. When the failure where the carrier concentration in gallium phosphide (GaP) wafer is out of a prescribed range is taken as an example, the failure rate is reduced to about one fifth thereof. Further, since it is possible to prevent a fault wafer from flowing to the next process in the device manufacturing process, this semiconductor wafer evaluation device can contribute to an improvement in the device yield.

Figure 3:
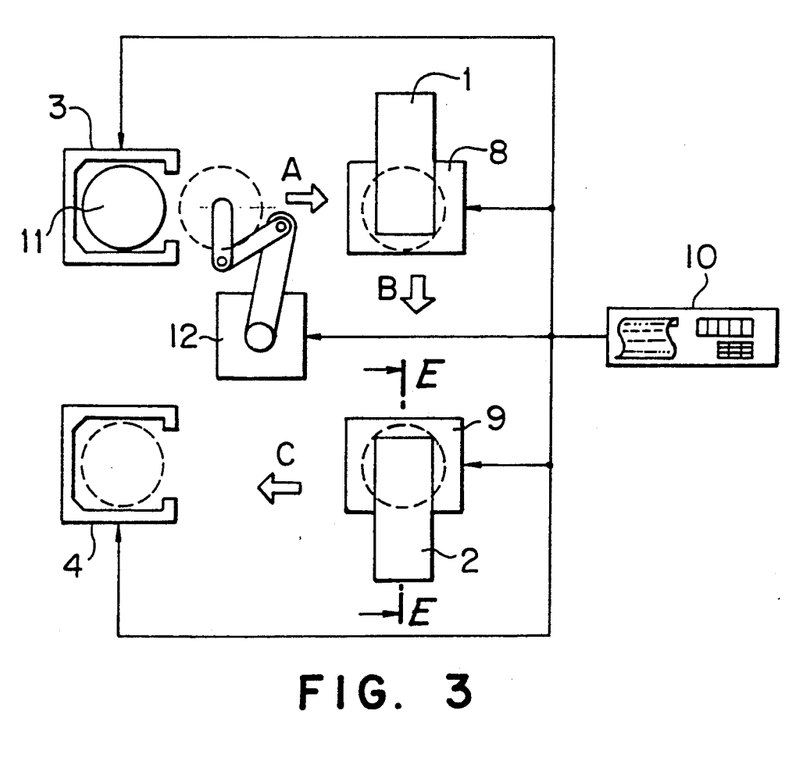
FIG. 3 is a block diagram showing the configuration of a semiconductor wafer evaluation apparatus according to a second embodiment of this invention.

A second embodiment will now be described, with reference to FIG. 3 showing the configuration thereof. In the above-mentioned first embodiment, semiconductor wafers are linearly carried or conveyed. On the contrary, the second embodiment is characterized in that a carrying device 12 positioned at the central portion rotationally carries or conveys wafers 11 along a path including the wafer supply cassette 3, the wafer stage 8 for the conductivity detector 1, the wafer stage 9 for the carrier mobility detector 2, and the wafer receiving cassette 4. This carrying device 12 includes a vacuum chuck, thus making it possible to make a rotation of 360 degrees of a sucked semiconductor wafer 11 by means of a crank mechanism. The same reference numerals are attached to other components which are the same as those of the first embodiment, respectively, and their explanation will be omitted.

This second embodiment can advantageously make modifications with ease to exchange the sequence of the measurement of conductivity and the measurement of carrier mobility, or to make a measurement for a second time for reconfirmation of measured values.

A partition wall serving to absorb an electromagnetic wave may be further provided between the conductivity detector 1 and the carrier mobility detector 2 in the first or second embodiment. It is preferable that the dimension of this partition wall be larger than the width dimension in a depth direction of at least the wafer stages 8 and 9, and that it be larger than both the upward and downward dimensions of magnetic bodies of magnetic field generation sources provided in the conductivity detector 1 and the carrier mobility detector, 2, respectively.

Figure 4:
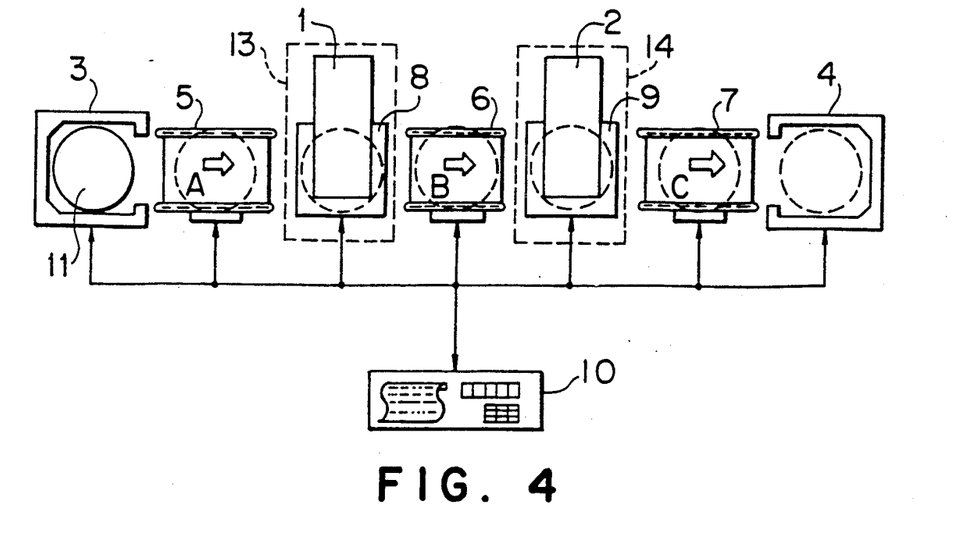
FIG. 4 is a block diagram showing an arrangement in the case where a partition wall is provided in the semiconductor wafer evaluation apparatus according to the first embodiment of this invention.
Figure 5:
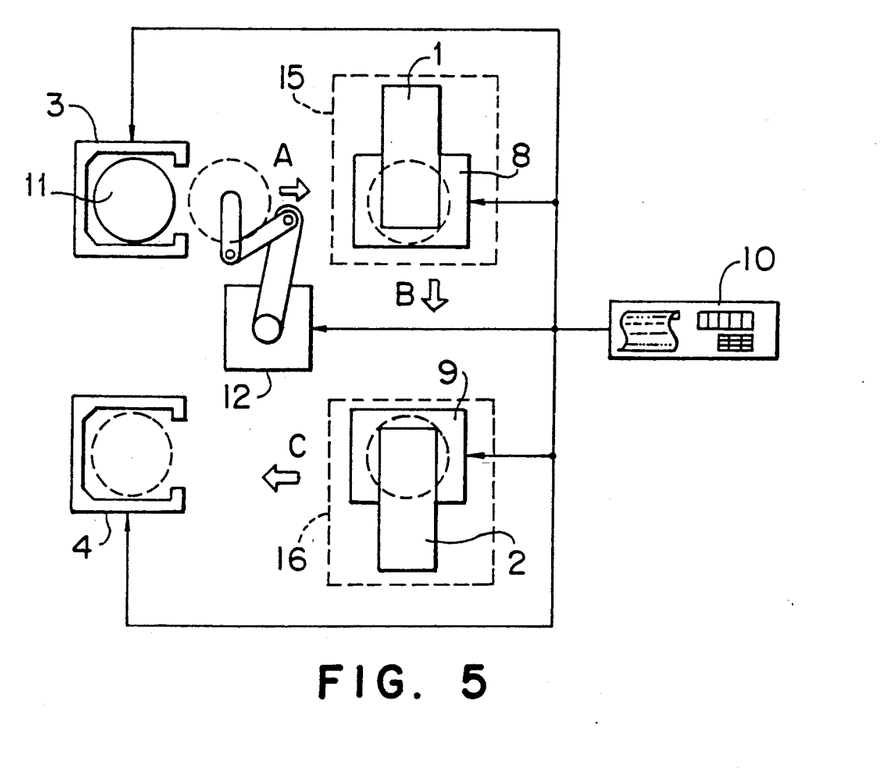
FIG. 5 is a block diagram showing an arrangement in the case where a partition wall is provided in the semiconductor wafer evaluation apparatus according to the second embodiment of this invention.

When the partition wall is implemented in the first embodiment, it is more effective that the partition wall be of a structure as shown in FIG. 4. Namely, the partition wall has a box structure to cover the conductivity detector 1 and the wafer stage 8. A partition wall 13, provided with slits at the portions through which the wafer 11 passes, may be provided with respect to the conductivity detector 1 and the wafer stage 8. Further, a similar partition wall 14 may be provided with respect to the carrier mobility detector 2 and the wafer stage 9. Similarly, also in the second embodiment, as shown in FIG. 5, a partition wall 15 to cover the conductivity detector 1 and the wafer stage 8 may be provided, and a partition wall 16 to cover the carrier mobility detector 2 and the wafer stage 9 may be provided.

By preventing interference between both detectors 8 and 9 by means of the partition walls 13 and 14, or 15 and 16, the respective detectors can be operated at the same time. Thus, the measurement time can be shortened, and the measurement accuracy and the reproducibility of measured values can be improved.

The result actually measured will now be described. The result obtained when a measurement is carried out without the partition wall will first be described. A procedure is taken to quarry out about 130 wafers of gallium phosphide (GaP) having a diameter of 2 inches and a thickness of 250 $\mu$m from one ingot to use 27 wafers extracted at random. By using a procedure to measure conductivity of the n-th wafer (n is an integer more than 1) at the same time while measuring the conductivity of the n+1-th wafer, two measurements are successively conducted. When attention is drawn to the unevenness of measured values with respect to 25 wafers where measurement times overlap with each other in this case, the conductivity and the carrier mobility were ±3% and ±7%, respectively. When the carrier concentration is calculated by using these two measured results, the result of ±10% was provided. When the fact that the conductivity, the carrier mobility and the carrier concentration are respectively ±5%, ±20%, and ±25% in the case where the conventional apparatus is used is taken into consideration, it is seen that all of the measurement accuracies are improved. In the case a where a measurement is conducted by using the Van Der Pauw method, it is considered that a high precision closer to that of this invention may be provided. However, as described above, since much time must be spent on measurement, in addition to destruction of the wafer, evaluations cannot be implemented for the total number of wafers. In contrast, in accordance with this embodiment, highly accurate measured values can be provided in a non-distructive manner and in a short measurement time.

When an approach is employed to partition the wafer stages 8 and 9 by a partition wall comprised of, e.g., a permalloy plate on which a painting material of, e.g., Nickel (Ni)-Zinc (Zn) system is coated to conduct a measurement under the state where only the portion through which the carrying means passes is removed, the results of the conductivity of ±1%, the carrier mobility of ±2%, and the carrier concentration of ±3% an provided. As stated above, it has become clear that the provision of both detectors 1 and 2 advantageously prevent interference, and, therefore, improve measurement accuracy.

Further, in a measurement by the carrier mobility detector 2 in the first or second embodiment, such a measurement may be conducted under the state where the detector 2 and the bottom surface of the wafer 11 tightly contact each other by vacuum suction. In such an apparatus, there is further provided a vacuum suction unit on the wafer stage 9, in addition to the passive unit including a pickup coil (double ring-shaped electrode) for detecting a Hall electromotive force produced on the surface of the wafer. When a wafer 11 is carried or conveyed onto the wafer stage 9, the bottom surface of the wafer 11 and the passive unit are made in tight contact with each other by vacuum suction, thus to increase the stability of the measurement work, resulting in improvements in the reproducibility of the measurement precision, and the like.

Figure 6A:
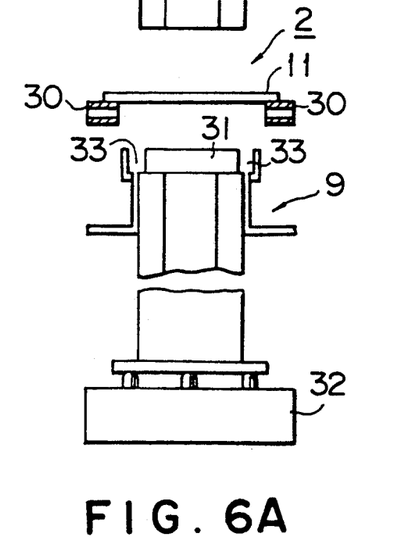
FIGS. 6A, 6B, 7A, 7B, 8A and 8B are schematic cross sectional views of a detector in the case where vacuum suction is used in the mobility detector of the semiconductor wafer evaluation apparatus according to the first embodiment of this invention.
Figure 6B:
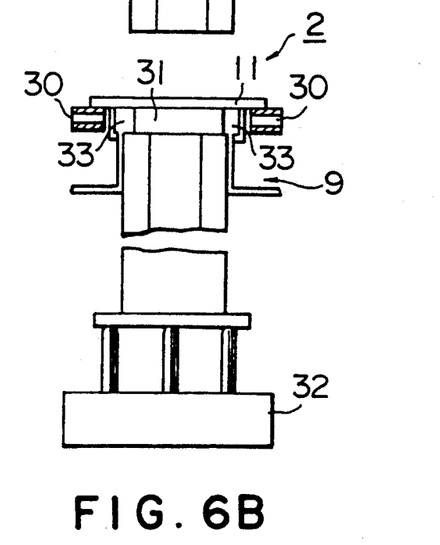
Figure 7A:
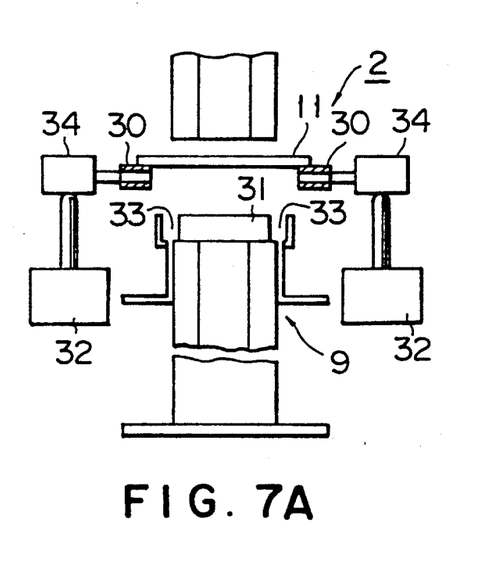
Figure 7B:
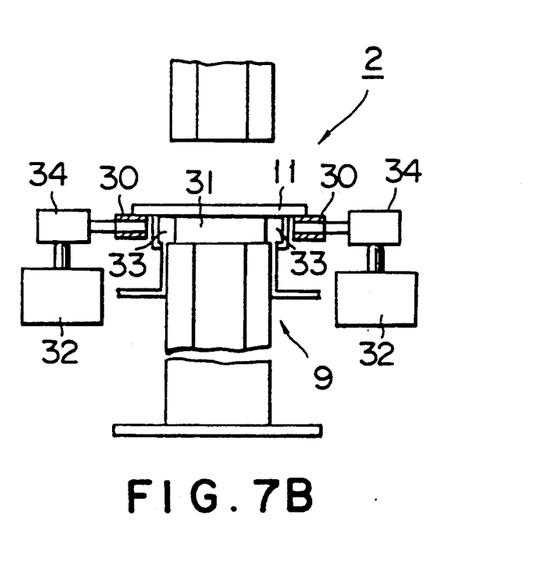
Figure 8A:
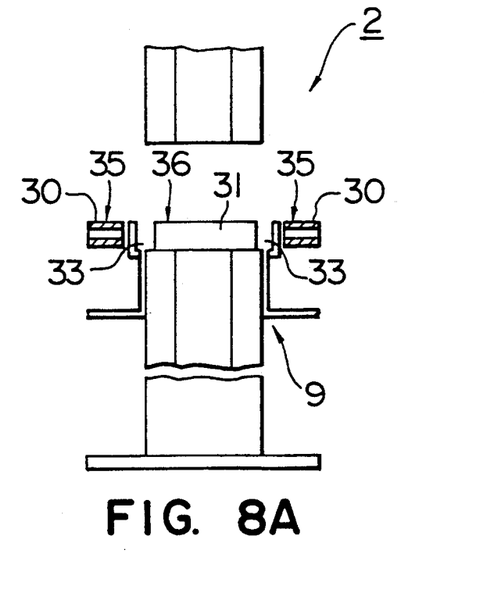
Figure 8B:
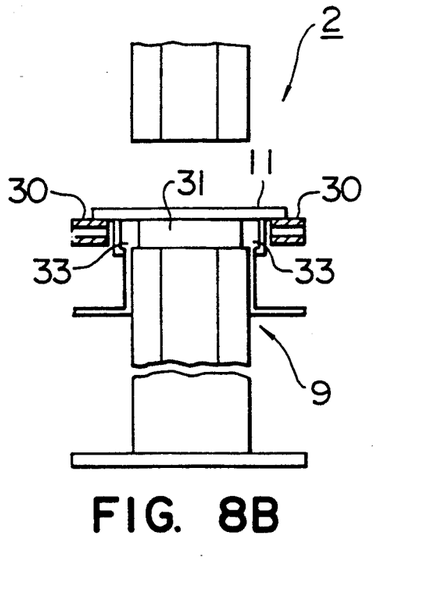

In the case of attempting to realize the vacuum suction by the carrier mobility detector 2 of the first embodiment, it is preferable to adopt an arrangement as in the three embodiments shown in FIGS. 6 to 8.

FIGS. 6 to 8 are all cross sectional views schematically showing only the principal part of the carrier mobility detector 2 along the lines D—D in FIG. 1.

Initially, in the apparatus of the structure shown in FIG. 6A, a wafer 11 is mounted on a carrying unit 30 of an indefinite or endless track. When the wafer 11 is carried or conveyed onto a passive unit 31 including a pickup coil provided on the wafer stage 9, the carrying operation of the carrying unit 30 is stopped to hold the wafer 11 on the passive unit 31. At this time, it is desirable that a gap of about 60 $\mu$m to several hundred $\mu$m be provided between the bottom surface of the wafer 11 and the passive unit 31 in order to prevent breakage of the passive unit 31 due to curvature of the wafer 11. An actuator 32 is provided on the wafer stage 9. Thus, the wafer stage 9 can be upwardly and downwardly moved in the direction of the wafer 11, permitting the passive unit 31 to contact the bottom surface of the wafer 11. As shown in FIG. 6B, after the passive unit 31 to be in contact with the bottom surface of the wafer 11, a vacuum suction unit 33 provided on the wafer stage 9 is evacuated by a vacuum pump (not shown) to thereby vacuum-suck the wafer 11 toward the passive unit 31, thus allowing both members to be tightly in contact with each other.

In the apparatus of the structure shown in FIGS. 7A and 7B, an actuator 32 is provided on a supporting body 34 for supporting a carrying unit 30. Thus, the carrying unit 30 can be upwardly and downwardly moved in a direction of the wafer stage 9. As stated above, when an arrangement is employed such that the carrying unit 30 itself can be moved, the weight of the portion to be moved can be advantageously lightened as compared to the arrangement adapted to move the wafer stage 9. The same reference numerals denote the same components as those of the apparatus shown in FIG. 6, respectively, and a repetitive explanation will be omitted.

In the apparatuses of the both configurations, it is preferable that the drive means, such as the actuator 32, etc. can perform a drive operation with high precision every several $\mu$m to several hundred $\mu$m. For permitting a drive operation with high precision as stated above, it is preferable to use an actuator 32 in which a piezoelectric element is assembled. It is well known that when a high voltage is applied to, e.g., a ceramic piezoelectric element, the element expands and contracts by the piezoelectric characteristic. This quantity of displacement is proportional to an applied voltage. Particularly, in the case of the ceramic piezoelectric element, it is possible to take the quantity of displacement as a large value. Namely, the ceramic piezoelectric element has an ability to sufficiently attain the quantity of displacement of several $\mu$m to several hundred $\mu$m necessary for this embodiment. In addition, response speed is fast, and reliability is sufficient.

Further, the actuator 32 is connected to the controller 10 shown in FIG. 1, and is controlled by the controller 10.

Further detailed operation of the apparatus thus constructed will now be described. After the wafer 11 is carried or conveyed onto the wafer stage 9, the controller 10 outputs a drive signal to the actuator 32 prior to start of measurement to upwardly or downwardly move the wafer stage 9 or the carrying unit 30, thus allowing the bottom surface of the wafer 11 and the passive unit 31 to be in contact with each other. After they are caused to be in contact with each other, the controller 10 outputs a suction start signal to a vacuum pump (not shown) to evacuate the vacuum suction unit 33 to vacuum-suck the bottom surface of the wafer 11 and the passive unit 31 to allow them to be tightly in contact with each other. Then, the controller 10 outputs a measurement start signal to the carrier mobility detector 2 to start measurement. After measurement is completed, the controller 10 outputs a vacuum suction release signal to a vacuum pump (not shown) to stop evacuation to open a valve (not shown) to fill the vacuum suction unit 33 with air to release the vacuum suction. Then, the controller 10 outputs a drive signal to the actuator 32 to upwardly or downwardly move the wafer stage 9 or the carrying unit 30, thus allowing the bottom surface of the wafer 11 and the passive unit 31 to be separate with regard to each other. Then, the con 10 outputs a carrying signal to the carrying unit 30 to move the wafer 11 to the next process.

The apparatus of the structure which is not provided with the actuator 32 is shown in FIGS. 8A and 8B. The same reference numerals are attached to the same components as those of the apparatus shown in FIGS. 6 and 7, respectively, and repetitive explanations will be omitted. In this apparatus, the top surface 35 of the carrying unit 30 and the top surface 36 of the passive unit 31 are fixed to be substantially flush with each other. Since a drive means such as an actuator, etc. is not required, low cost construction can be provided.

Figure 9:
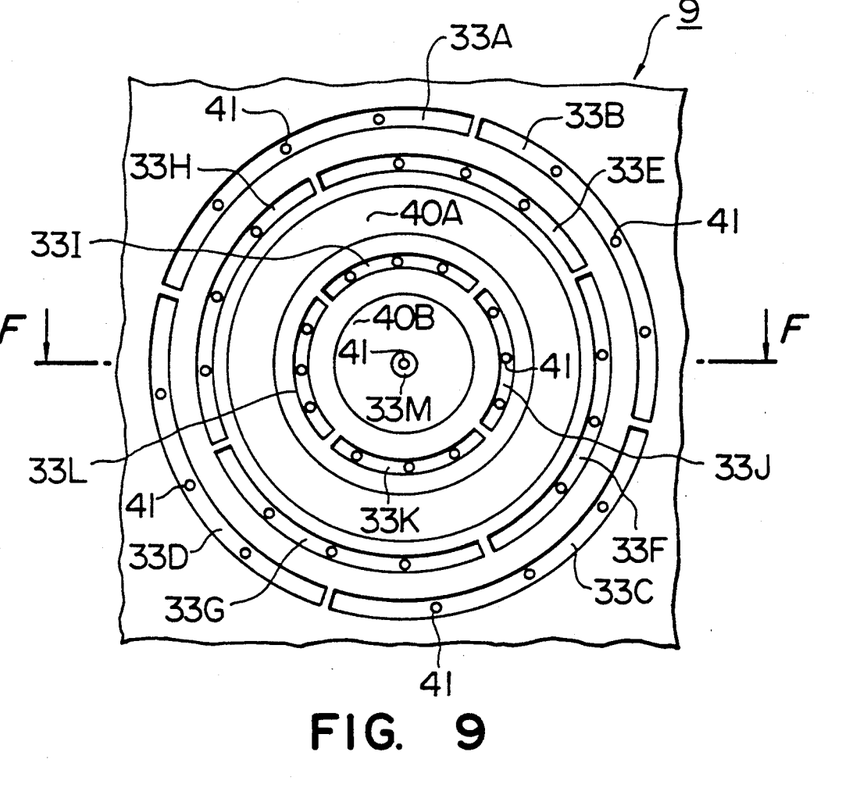
FIG. 9 is a plan view schematically showing a preferred wafer stage in the case where vacuum suction is used in the mobility detector of the semiconductor wafer evaluation apparatus of this invention.
Figure 10:
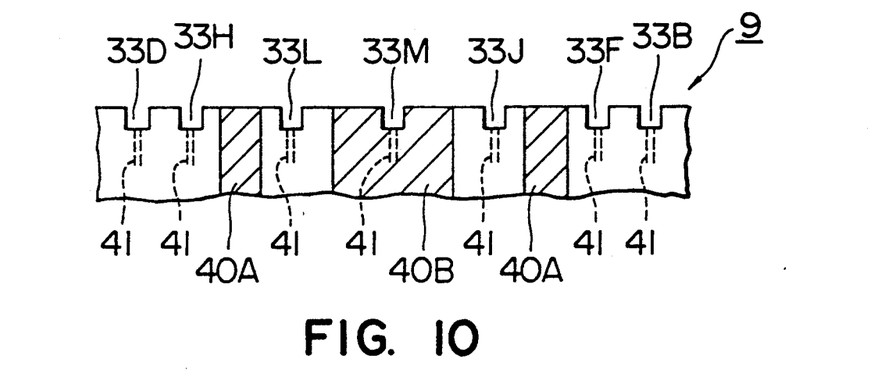
FIG. 10 is a cross sectional view taken along the F—F line in FIG. 9, and FIGS. 11A, 11B, 12A, 12B, 13A and 13B are schematic cross sectional views of a detector in the case where vacuum suction is used in the mobility detector of the semiconductor wafer evaluation apparatus according to the second embodiment of this invention.

Further, in this invention, in view of shifts of the wafer stop position produced, resulting from the fact that the wafer 11 is carried or conveyed, shifting in advance the wafer stop position in order to measure carrier mobilities (plane distributions) at various portions of the wafer 11, it is preferable to divide the vacuum suction unit 33 into a plurality of sections. When an arrangement, such that the vacuum suction unit 33, is divided into a plurality of sections is employed, even if the position of the wafer 11 on the wafer stage is shifted, vacuum suction can be compensated for by any suction section. In this case, it is desirable that the divided suction sections are sucked by independent suction systems, respectively. The schematic plan of a wafer stage 9 including such a vacuum suction unit divided into a plurality of sections is shown in FIG. 9, and the cross section taken along the line F—F in FIG. 9 is shown in FIG. 10.

As shown in these figures, a pickup coil of double ring-shaped electrodes 40A and 40B is provided on the wafer stage 9, thus constituting the passive unit of the detector. Further, a plurality of vacuum suction sections 33A to 33M are provided. At the vacuum suction sections 33A to 33M, vacuum suction holes 41 communicating with these vacuum suction sections and further communicating with a vacuum pump (not shown) are provided, respectively. These vacuum suction sections 33A to 33M are of a multiple structure such that they are formed in a ring-shape surrounding the passive unit. Namely, the first ring on the outermost circumferential side is constructed by suction sections 33A to 33D. Similarly, toward the inner side in succession, the second and third rings are constructed by the suction sections 33E to 33H and the suction sections 33I to 33L, respectively. A suction unit 33M is provided substantially at the center of the stage, i.e., substantially at the center of the pickup coil further inside of the third ring. When the suction unit 33M is further arranged substantially in the center of the pickup coil as stated above, the reproducibility of measurement and the stability of work can be further improved, as referred to in the experimental result which will be described later.

It is not required that the vacuum suction sections 33A to 33M be formed in a ring-shape. An arbitrary number of suction sections linearly formed may be included therein, and/or these suction sections may take a combined linear shape, e.g., square, rectangle, polygon, etc. It is to be noted that where the vacuum suction unit is molded in the form of square, or rectangle, etc., it is desirable to allow the four corners to take a tapered shape or a shape caused to correspond to roundness of the wafer outer periphery by adopting a curved portion. If the four corners are in a sharp rectangular shape because they do not correspond to roundness of the wafer outer periphery, there is a possibility that these corners may be exposed to the outside, thus reducing the effect of the vacuum suction.

The reproducibility experimental result obtained by repeatedly conducting the carrier mobility of the same wafer of gallium phosphide (GaP) while carrying out vacuum suction will now be described with reference to the following table 1.

TABLE 1

| Times of Measurements | 1 | 2 | 3 | 4 | 5 | Average | Standard Deviation |
|---|---|---|---|---|---|---|---|
| | | | | | | | Unit: $cm^2/V \cdot s$ |
| S-1 | 120.1 | 120.5 | 119.8 | 120.2 | 120.3 | 120.18 | 0.23 |
| S-2 | 120.2 | 120.5 | 119.7 | 120.2 | 120.1 | 120.14 | 0.25 |
| S-3 | 119.8 | 120.3 | 119.5 | 120.1 | 119.3 | 119.8 | 0.37 |
| S-4 | 115.7 | 118.4 | 113.2 | 117.0 | 119.3 | 116.72 | 2.14 |
| S-5 | 110.5 | 112.3 | 103.6 | 115.5 | 102.4 | 108.86 | 5.06 |

In this table, S-1 represents the case of an apparatus provided with a plurality of multiple ring-shaped vacuum suction sections and the innermost circumferential vacuum suction section arranged substantially in the center of the pickup coil. S-2 represents the case of an apparatus provided with a plurality of multiple ring-shaped vacuum suction sections and the innermost circumferential innermost vacuum suction section arranged slightly shifted with respect to the center of the pickup coil. S-3 represents the case for an apparatus provided with a plurality of multiple ring-shaped suction sections wherein a portion of the suction unit is extruded from the wafer. S-4 represents the case for an apparatus provided with a unitary suction unit wherein a portion of the suction unit is extruded from the wafer. S-5 represents the case of an apparatus provided with no suction unit.

As shown in this table, in the case of S-1, the standard deviation is 0.23. This case indicates the best reproducibility of measurement. It is to be noted that the apparatus labeled S-1 corresponds to the apparatus shown in FIGS. 9 and 10. Similarly, also in the case of S-2, the standard deviation is 0.25. Although the reproducibility of S-2 is slightly inferior to that of S-1 provided with the suction section in the center, it exhibits a reproducibility sufficient for actual use. S-3 represents, as described above, the case where the mounting position of the wafer is shifted in advance, and a portion of plural suction sections is extruded from the wafer. In this case, the standard deviation is 0.37. A reproducibility which is inferior by no means to that in the case where a portion of plural suction sections is not extruded from the wafer is provided. Further, S-4 indicates the case where the apparatus has only one suction unit and a portion thereof is extruded from the wafer. In this case, the standard deviation becomes the slightly large value of 2.14. However, when it is compared to the case of S-5 where any vacuum suction is not carried out, the standard deviation is reduced to one half of that of 5.06. This truly indicates that the reproducibility is improved by vacuum suction.

The reproducibility experiment on the structure of the apparatus was carried out by the same method as that of the above-mentioned method, and the result obtained is shown in Table 2. It is to be noted that a wafer stage of the apparatus used in the experiment has the structure shown in FIGS. 9 and 10.

TABLE 2

| Times of Measurements | 1 | 2 | 3 | 4 | 5 | Average | Standard Deviation |
|---|---|---|---|---|---|---|---|
| | | | | | | | Unit: $cm^2/V \cdot s$ |
| E-1 | 120.3 | 119.9 | 120.4 | 120.5 | 120.1 | 120.24 | 0.22 |
| E-2 | 120.1 | 120.5 | 119.8 | 120.2 | 120.3 | 120.18 | 0.23 |
| E-3 | 118.5 | 115.6 | 117.6 | 118.0 | 116.3 | 117.2 | 1.08 |

In this table, E-1 indicates the case of the stage movable type apparatus shown in FIG. 6. Similarly, E-2 and E-3 indicate the case of the carrying unit movable apparatus and the case of the stage/carrying unit fixed type apparatus, respectively.

As shown in this table, excellent reproducibilities such that the standard deviation is 0.22 in the case of the movable apparatus indicated by E-1 and the standard deviation is 0.23 in the case of the movable apparatus indicated by E-2 are both provided. In the case of E-3 of the stage/carrying unit fixed type apparatus, the difference between the upper surface of the stage and the upper surface of the carrying unit is set to about 60 $\mu$m, and measurement is conducted with the vacuum sucking force being increased. However, the result of a slightly lowered reproducibility that the standard deviation is 1.08 is provided. From these results, both the stage movable apparatus and the carrying unit movable apparatus have extreme excellence of reproducibility. Although the reproducibility of the fixed type apparatus is somewhat inferior to that of the movable type apparatus, it has the economical benefit that a drive means for making upward and downward movements is not required.

Figure 13A:
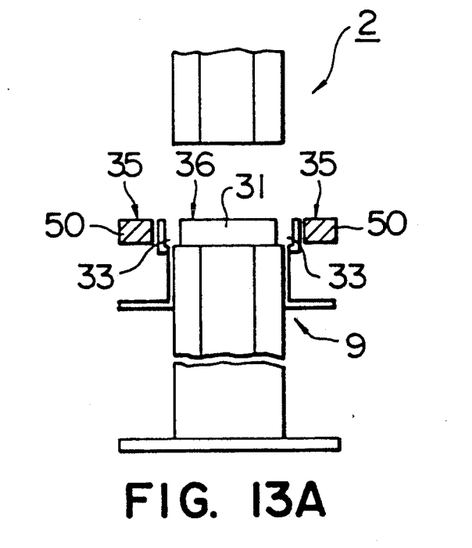
Figure 13B:
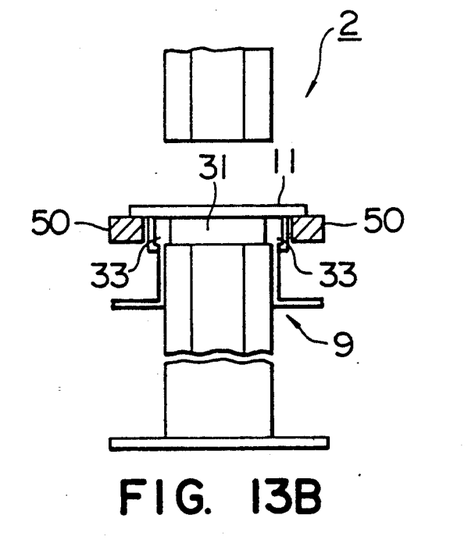

To realize vacuum suction by using the carrier mobility detector 2 of the second embodiment, it is preferable to provide arrangements as in the three examples shown in FIGS. 13 to 15.

Figures 11A, 12A:
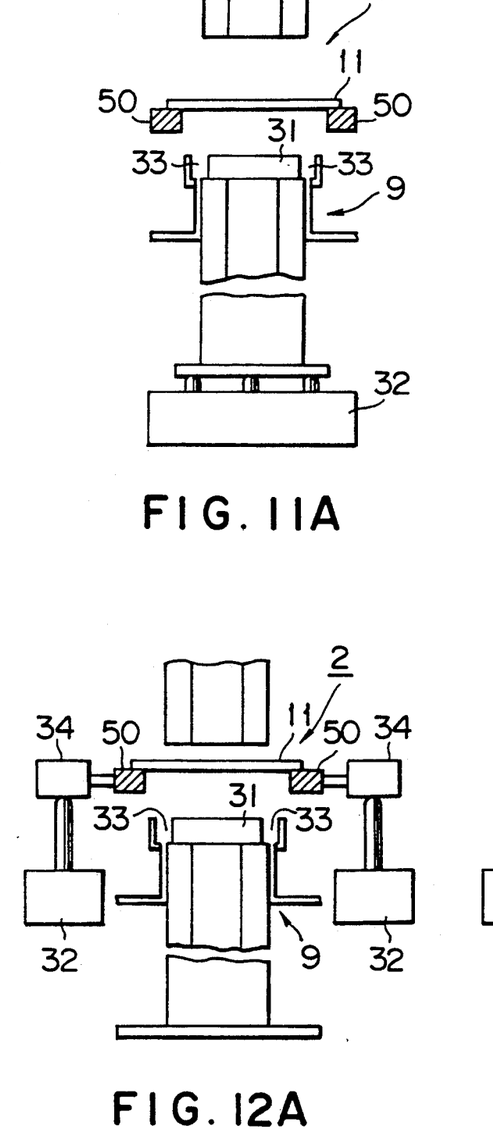
Figures 11B, 12B:
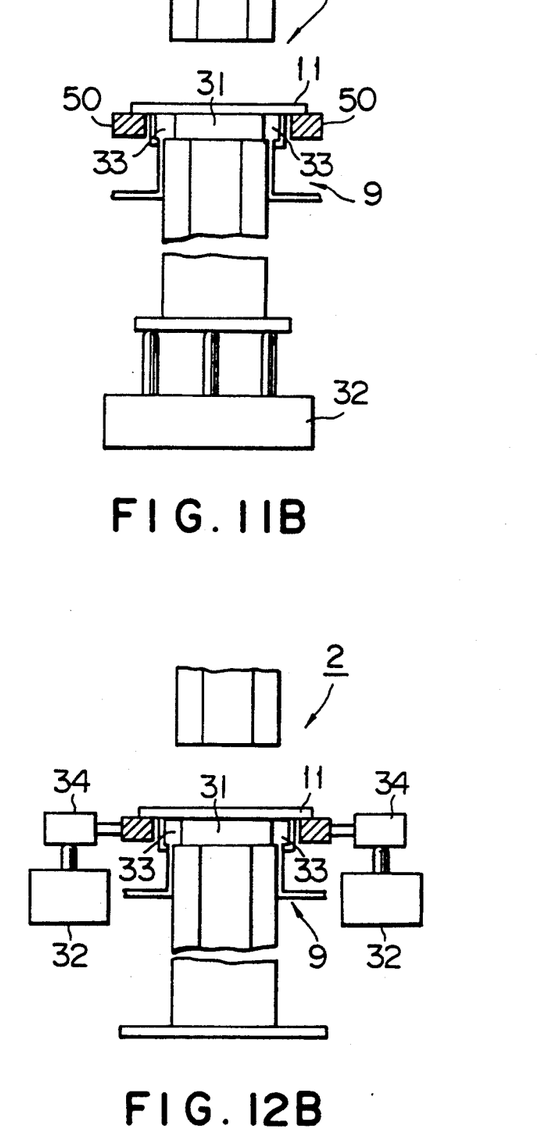

FIGS. 11 to 13 are cross sectional views schematically showing only the principal part of the carrier mobility detector 2 along the E—E line in FIG. 3.

As shown in these figures, in the case of realizing vacuum suction in the second embodiment, because a caterpillar carrying unit is not provided, it is preferable to replace it by the wafer mounting unit 50. The apparatus of FIGS. 11A and 11B corresponds to the apparatus of FIGS. 6A and 6B. Similarly, the apparatus of FIGS. 12A and 12B and the apparatus of FIGS. 13A and 13B correspond to the apparatus of FIGS. 7A and 7B and the apparatus of FIGS. 8A and 8B, respectively. The same reference numerals are attached to the same components as those of these apparatuses, respectively, and the repetitive explanation will be omitted.

The device for carrying out vacuum suction may be covered with a partition wall of a box structure adapted to absorb an electromagnetic wave.

Further, in measurement by the carrier mobility detector 2 in the first or second embodiment, a method may be adopted to cool the wafer to conduct a measurement under a low temperature environment.

As the method of cooling the wafer, there is known as an example a method to set the wafer 11 on the carrier mobility detector 2 shown in FIG. 1, for example, thereafter to allow, e.g., high pressure nitrogen gas to flow in the gap of the detector 2, thus utilizing the adiabatic expansion of the high pressure gas. As other examples, there are known a method in which pickup coils 40A and 40B and vacuum suction sections 33A to 33M, etc., shown in FIG. 9, etc., and thermoelectric cooling elements, etc. utilizing the Peltier endothermic effect are embedded on the surface in contact with the wafer 11 in a range such that the functions peculiar to the above-mentioned members are not damaged, a method in which a cooling unit is provided in the middle of the wafer carrying path, and the like.

In the case of cooling the wafer, for preventing adhesion of water drop, it is desirable to partition a portion of the wafer or the entirety thereof by an air curtain, etc. while the measurement time is prolonged by an amount required for cooling the wafer. The measurement time is shortened to much more extent, in fact than in the case of conducting a measurement at a low temperature by using the conventional Van Der Pauw method.

As the temperature of the wafer, it is possible to cool the wafer from the room temperature to about 100K. Further measurement of the carrier mobility under high temperature environment by heating may be conducted. In addition, both mobility and conductivity may be measured.

The measurement under the low temperature or high temperature environment can be implemented in combination with the above-described method of using a partition wall for absorbing an electromagnetic wave, or the above-described method of carrying out vacuum suction, and that such methods may be applied in various modified manners. In addition, with these methods, it is possible to automatically make a measurement in a non-destructive manner.

It is to be noted that the above-described embodiments are all of illustrative nature, and therefore are not limited to this invention. In accommodating or receiving wafers which have been already subjected to measurement, a plurality of wafer receiving cassettes 4 may be provided in order to classify the wafers by measured values. In addition, an approach may be employed to incorporate this semiconductor wafer evaluation apparatus into other wafer process apparatuses to use it as an in-process monitor.

What is claimed is:

1. An apparatus for measuring the electrical characteristics of a semiconductor wafer comprising:
   a conductivity detector for allowing an eddy current to be produced on a semiconductor wafer to detect the magnitude of said eddy current to determine the conductivity of said semiconductor wafer,
   a carrier mobility detector for allowing an eddy current to be produced on said semiconductor wafer to detect the Hall electromotive force produced in a magnetic field by said eddy current to determine the carrier mobility,
   said conductivity detector and said carrier mobility detector being independently arranged so that detections can be made under optimum conditions, respectively,
   means for calculating a carrier concentration of said semiconductor wafer on the basis of a relationship among said conductivity, carrier mobility and carrier concentration using values of said conductivity and said carrier mobility which have been determined and for controlling the respective operations of said conductivity detector, said carrier mobility detector and said wafer carrying means, in accordance with a predetermined procedure so that the measuring of conductivity and the measurement of carrier mobility are carried out in succession, and
   first wafer carrying means for carrying said semiconductor wafer between said conductivity detector and said carrier mobility detector.

2. An apparatus as set forth in claim 1, which further comprises a partition wall made of a material for absorbing an electromagnetic wave in order to avoid interference based on said electromagnetic wave between said conductivity detector and said carrier mobility detector.

3. An apparatus as set forth in claim 2, wherein said material for absorbing an electromagnetic wave is such that ferrite paint is coated on the surface of a permalloy plate.

4. An apparatus as set forth in claim 1, wherein said apparatus further comprises first accommodating means for accommodating or receiving wafers to be measured, second accommodating means for accommodating wafers which have been already measured, a second wafer carrying means provided between said first accommodating means and said conductivity detector, and a third wafer carrying means provided between said second accommodating means and said carrier mobility detector.

5. An apparatus as set forth in claim 4, wherein said both detectors are linearly arranged between said first accommodating means for accommodating wafers to be measured and said second accommodating means for accommodating wafers which have been measured, wafers being carried or conveyed by said first to third wafer carrying means on a carrying path between said first and second accommodating means.

6. An apparatus as set forth in claim 5, wherein said first to third wafer carrying means constitute an endless track.

7. An apparatus as set forth in claim 4, wherein said first accommodating means for accommodating wafers to be measured, said second accommodating means for accommodating wafers which have been already measured, and said conductively and carrier mobility detectors are arranged substantially equidistant from said carrying means, said first, second and third carrying means comprising a crank arm to carry or convey wafers.

8. An apparatus as set forth in claim 1, wherein, in measurement of said carrier mobility, said wafer and a passive unit provided on a wafer stage of said carrier mobility detector are caused to be in contact with each other to suck said wafer by a plurality of suction units or segments at least doubly arranged surrounding said passive unit in said contact state to carry out said measurement under the state where said wafer and said passive unit are tightly in contact with each other.

9. An apparatus as set forth in claim 8, which further comprises means for upwardly and downwardly driving a supporting body of said wafer in order to allow said wafer and said passive unit to be in contact with each other.

10. An apparatus as set forth in claim 8, which further comprises means for upwardly and downwardly driving said passive unit in order to allow said wafer and said passive unit to be in contact with each other.

11. An apparatus as set forth in claim 8, wherein said suction units are arranged substantially in the form of a ring.

* * * * *